(12) United States Patent
Pelster et al.

(10) Patent No.: US 10,372,446 B2
(45) Date of Patent: Aug. 6, 2019

(54) TECHNOLOGY TO DYNAMICALLY MODULATE MEMORY DEVICE READ GRANULARITY

(71) Applicant: Intel Corporation, Santa Clara, CA (US)

(72) Inventors: David J. Pelster, Longmont, CO (US); Sudhakar Ayyasamy, El Dorado Hills, CA (US); Mark Anthony S. Golez, Folsom, CA (US); Yogesh B. Wakchaure, Folsom, CA (US); Yu Du, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 15/640,484

(22) Filed: Jul. 1, 2017

(65) Prior Publication Data

US 2019/0004796 A1    Jan. 3, 2019

(51) Int. Cl.
| | |
|---|---|
| *G06F 13/00* | (2006.01) |
| *G06F 9/30* | (2018.01) |
| *G06F 12/02* | (2006.01) |
| *G06F 15/78* | (2006.01) |
| *H03K 19/177* | (2006.01) |
| *G06F 3/06* | (2006.01) |
| *G06F 12/06* | (2006.01) |
| *G06F 11/00* | (2006.01) |

(52) U.S. Cl.
CPC ........ *G06F 9/30003* (2013.01); *G06F 3/0611* (2013.01); *G06F 11/004* (2013.01); *G06F 12/0238* (2013.01); *G06F 12/0638* (2013.01); *G06F 15/7867* (2013.01); *H03K 19/1776* (2013.01)

(58) Field of Classification Search
CPC ........................... G06F 3/0611; G06F 11/004; G06F 12/0238; G06F 12/0638; G06F 15/7867
See application file for complete search history.

(56) References Cited

U.S. PATENT DOCUMENTS

| | | | | |
|---|---|---|---|---|
| 5,809,523 | A * | 9/1998 | Kayes ................. | G06F 11/3419 711/118 |
| 9,330,735 | B2 * | 5/2016 | Harris .................... | G11C 5/025 |
| 9,645,938 | B2 * | 5/2017 | Kranich .............. | G06F 12/0802 |
| 9,672,149 | B2 * | 6/2017 | Park ........................ | G11C 16/12 |

(Continued)

*Primary Examiner* — Sean D Rossiter
(74) *Attorney, Agent, or Firm* — Jordan IP Law, LLC

(57) ABSTRACT

Technology to dynamically modulate read granularity of a memory device. A computing system may include a controller and one or more memory devices coupled to the controller, the one or more memory devices including instructions, which when executed by the controller, may cause the computing system to determine whether a read to a memory device satisfies a sub-page read policy. In addition, the instructions, when executed, may cause the computing system to issue a sub-page read command to retrieve data from the memory device at sub-page granularity when the read satisfies the sub-page read policy. Moreover, the instructions, when executed, may cause the computing system to issue a full-page read command to retrieve the data at full-page granularity when the read does not satisfy the sub-page read policy or when a read for a segment of sequentially stored data does not satisfy the sub-page read policy.

25 Claims, 4 Drawing Sheets

(56) References Cited

U.S. PATENT DOCUMENTS

| | | | |
|---|---|---|---|
| 2007/0035991 A1* | 2/2007 | Chen | G11C 16/26 365/185.01 |
| 2013/0201770 A1* | 8/2013 | Harris | G11C 5/025 365/189.011 |
| 2016/0295051 A1* | 10/2016 | Dandoko | H04N 1/00822 |

* cited by examiner

TECHNOLOGY TO DYNAMICALLY MODULATE MEMORY DEVICE READ GRANULARITY

TECHNICAL FIELD

Embodiments generally relate to a memory device. More particularly, embodiments relate to dynamic modulation of memory device read granularity

BACKGROUND

Non-volatile memory (NVM) may be used to persistently store data in a solid state device (SSD). Indeed, SSDs that include NVM such as Intel® (a registered trademark of Intel Corporation in the U.S. and/or other countries) data center SSDs may have performance advantages over conventional storage drives including running demanding workloads simultaneously, lowering costs, increasing system utilization for greater responsiveness and faster time to market, and so on. Meanwhile, reads to a memory device may be associated with increased latency since a read may always occur at full-page granularity. Moreover, random read workloads may particularly exacerbate inefficiencies with regard to memory overhead, performance, and so on. Thus, there is substantial room for improvement to minimize inefficiencies with regard to reads to memory devices including NVM.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
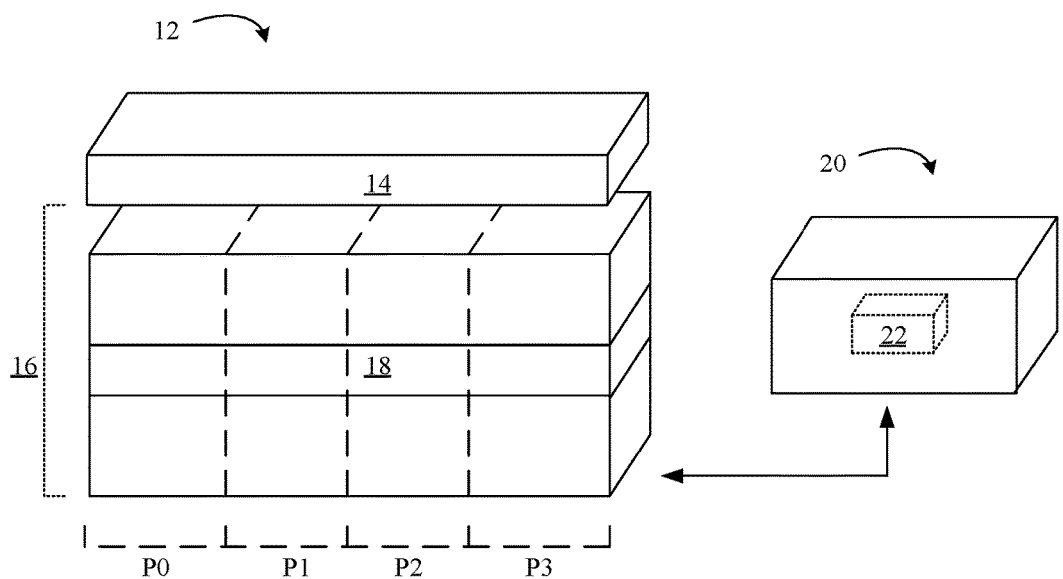
FIG. 1 is a block diagram of an example of a system to dynamically modulate read granularity for a read to a memory device according to an embodiment.

Turning now to FIG. 1, a system 10 is shown to dynamically modulate read granularity for a read to a memory device 12 including non-volatile memory (NVM). For example, the memory device 12 may include NAND memory such as a NAND flash memory, a three-dimensional (3D) NAND memory array device, a solid state drive (SSD), and so on. In the illustrated example, the memory device 12 is organized into a memory buffer 14 (e.g., a cache register, etc.) and a logical unit node (LUN) 16 that includes a certain number of blocks 18 (e.g., 2192 blocks per LUN, etc.). The memory device 12 may be further partitioned into multiple planes (e.g., "Plane 0", "Plane 1", "Plane 2", "Plane 3") that include a certain number of blocks 18 (e.g., 548 blocks per plane). Moreover, the size of a block 18 might include a certain number of pages (e.g., 1,536 pages per block, etc.) and each page may include a certain number of bytes (e.g., 16 KB+2208 bytes per page, etc.). While one die is shown in the system 10, multiple dice may be stacked in a single package to increase data storage capacity.

A read to the memory device 12 may incur latency when a page is fetched from LUN 16 and loaded to the memory buffer 14, which then becomes available to clock out data. The latency, however, affects performance since a read to the memory device 12 may always occur at full-page granularity (e.g., 16 KB) even if data less than a full-page length is needed (e.g., 4 KB). For example, a read may only require 4 KB of a 16 KB page and if the full 16 KB is fetched when only 4 KB is needed then a read command may require more resources (power, etc.) and may incur the overhead latency of the full 16 KB. In addition, random read workloads, which may be the most common type of workload, may particularly increase inefficiencies. For example, random workloads with I/O read size less than a page involve reading an entire page in a single read, thereby incurring a much higher NAND read time (tR) for a full page read compared a partial page read (e.g., 87% more tR for a full page read than a quarter of a full page read). The metric (tR) may refer to a period of time to complete a NAND read which may be calculated from the time a command is issued to the memory device 12 to the time when data is available at the memory buffer 14. Thus, each NAND read that might only hit 4 KB of each 16 KB full page incurs overhead that degrades performance or that wastes resources (e.g., registers, power, etc.).

Accordingly, the system 10 includes a controller 20 to dynamically modulate read granularity for a read to the memory device 12. In the illustrated example, the controller 20 includes logic 22 (e.g., application specific integrated circuit/ASIC, complementary metal oxide semiconductor/CMOS, transistor-transistor logic/TTL, and/or other fixed functionality technology) to implement one or more aspects of the technology described herein. The system 10 may also store instructions at a memory device, such as the memory device 12, which when executed by the controller 20 (e.g., an embedded processor, etc.), cause the controller 20 to implement one or more aspects of the technology described herein. As discussed in detail below, sub-page read capabilities of the memory device 12 and/or data placement at the memory device 12 may be leveraged to optimally dispatch reads (e.g., for most common read workloads, etc.) that minimize latency, maximize bandwidth, minimize waste of resources, etc., which improves the operation of the system 10, of the memory device 12, and so on.

Figure 2:
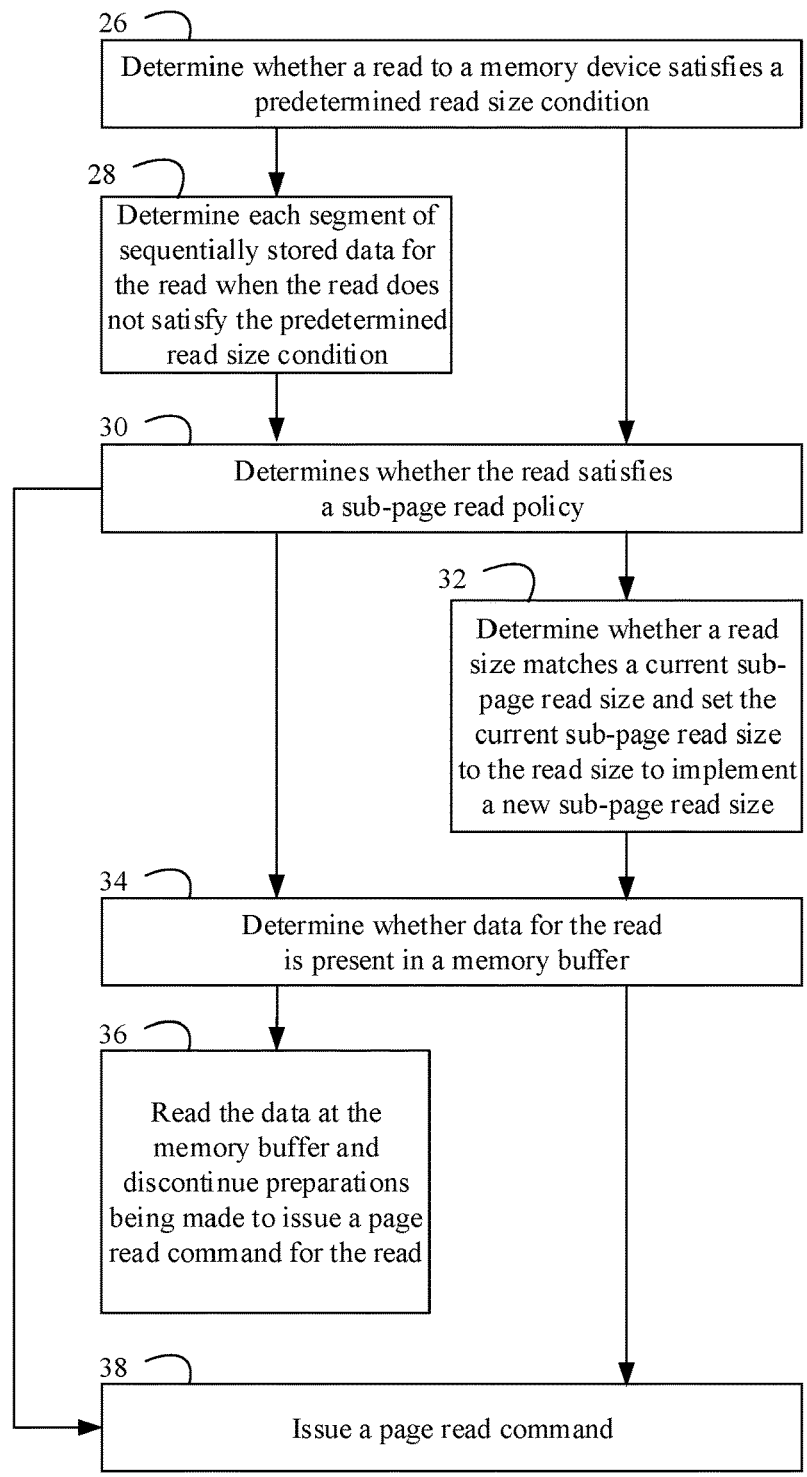
FIG. 2 is a flowchart of an example of a method to dynamically modulate read granularity for a read to a memory device according to an embodiment.

FIG. 2 shows a method 24 to dynamically modulate read granularity for a read to a memory device according to an embodiment. The method 24 may generally be implemented by a controller such as, for example, the controller 20 (FIG. 1), and/or in logic such as, for example, the logic 22 (FIG. 1), already discussed. The method 24 may be implemented as a set of logic instructions stored in a machine- or computer-readable storage medium such as random access memory (RAM), read only memory (ROM), programmable ROM (PROM), firmware, flash memory, three dimensional (3D) cross point memory (3DXP), etc., in configurable logic such as, for example, programmable logic arrays (PLAs), field programmable gate arrays (FPGAs), complex programmable logic devices (CPLDs), or any combination thereof.

For example, computer program code to carry out operations shown in the method 24 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 26 determines whether a read to a memory device satisfies a predetermined read size condition. For example, block 26 may determine a host has issued a read request to read a certain amount of data. The host may include, for example, a host processor, a host application, and so on, wherein the memory device may include NVM such as in the memory device 12 (FIG. 1), already discussed. Moreover, the predetermined read size may be a configurable (e.g., 4 KB, 8 KB, etc.). Thus, block 26 may compare the predetermined read size with the read size from the host read request to determine whether the read size satisfies the predetermined read size condition. For example, block 26 may determine that the read satisfies the predetermined read size condition when the read size is less than or equal to the predetermined read size.

Illustrated processing block 28 determines each segment of sequentially stored data for the read when the read does not satisfy the predetermined read size condition. A segment of sequentially stored data may correspond to a sequential workload (e.g., render video data, audio data, image data, etc.) or to a random workload (e.g., operating system startup, etc.). For example, a sequential workload may involve a 32 KB read size (e.g., a 32 KB sequential read) that corresponds to a 32 KB segment of sequentially stored data. In another example, a sequential workload may involve a series of 4 KB sequential read requests each having a 4 KB read size that each correspond to a single segment of 4 KB sequentially stored data. In a further example, a random workload may involve a 32 KB random read corresponding to a first 4 KB segment of sequentially stored data at a first location (e.g., a first die, a first NAND array, etc.), a second 8 KB segment of sequentially stored data at a second location (e.g., a second die, etc.), a third 16 KB segment of sequentially stored data at a third location (e.g., a third die, etc.), and a fourth 4 KB segment of sequentially stored data at a fourth location (e.g., a fourth die, etc.).

Block 28 may, therefore, determine each segment of sequentially stored data when the read size of the read request from the host is greater than the predetermined read size. Block 28 may, for example, determine each segment based on the workload. For example, block 28 may determine that the read is a sequential read based on the type of workload (e.g., video data, audio data, image data, etc.), and assume that the corresponding write was a sequential write. Thus, for example, block 28 may determine that a 32 KB read is a sequential read for 32 KB of contiguously stored data when the workload is a sequential workload. Similarly, block 28 may determine that a series of 4 KB reads are sequential reads for separate 4 KBs of contiguously stored data.

Block 28, however, may determine each segment of sequentially stored data by identifying the physical location of all of the data for the read. Thus, and continuing with the random workload example above that may involve a 32 KB random read, block 28 may determine that a 32 KB read is a random read for 32 KB of randomly stored data by identifying all of the data (e.g., the first to fourth locations of the data) in the memory device corresponding to the 32 KB read. Block 28 may also prepare to dispatch a separate command for each location as a segment. For example, block 28 may collect resources needed (e.g., from a controller perspective, etc.) to implement a direct memory access (DMA) and to dispatch separate commands for each location as a segment.

Illustrated processing block 30 then determines whether the read satisfies a sub-page read policy. For example, block 30 may determine whether the read satisfies a physical requirement of the memory device to implement a sub-page read. In one example, block 30 checks whether a data block, such as the block 18 (FIG. 1), already discussed, that is to be accessed via a sub-page read is a closed block (e.g., fully written block, a block having every NAND page written, etc.). In another example, block 30 checks whether the read falls within a certain boundary or a certain page limit, wherein all data within the boundary or the page limit may be available for a sub-page read. Thus, block 30 verifies whether the read meets technology requirements of a particular physical memory device (e.g., of a NAND component, etc.) to allow and/or issue a sub-page read. Block 30, however, may determine and/or verify that there are no physical requirements on the memory device (e.g., sub-page reads allowed without any physical restrictions such as page restrictions) to restrict sub-page reads.

Block 30 may further determine whether the read satisfies a random read requirement to implement a sub-page read. For example, only random read data may qualify for sub-page reads. Thus, block 30 may determine whether a read that satisfies the predetermined read size condition is a random read in a similar process already discussed with regard to block 28. For example, block 30 may determine that the read is a sequential read or random read based on the workload, is a sequential read or a random read based on physical location of the data, etc. Block 30 may also use the determination made at block 28 that the read is a sequential read or a random read. Notably, therefore, a 4 KB sequential read would not be completed at sub-page granularity as failing to satisfy the random read requirement even though the size of the data involved in the read satisfies a 4 KB predetermined read size and may be attractive for sub-page granularity. Rather, a full-page read or a memory buffer read may be implemented. In this regard, for example, a full-page read may be preferred due the sequential placement of the data on the memory device and therefore a full-page read may be implemented. As discussed below, a memory buffer read may be preferred when the data is in a memory buffer.

Block 30 may further determine whether the read satisfies a maximum sub-page read size to implement a sub-page read. The maximum sub-page read size may refer to a configurable length up to which a sub-page read may be implemented (e.g., maximum read granularity). For example, the maximum sub-page read size may be configurable up to half of a full-page read size (e.g., half of 16 KB). Thus, for example, block 30 may determine that a 4 KB random read which satisfies the predetermined read size condition satisfies the maximum sub-page read size when the predetermined read size is 4 KB and the maximum sub-page read size is 4 KB or 8 KB.

Similar to the evaluation for compliance with the physical requirement and the compliance with the random read requirement via the workload type detection discussed above, all reads may be evaluated for compliance with a maximum sub-page read size. Accordingly, for example, block 30 may determine that a 4 KB read for a segment of 4 KB sequentially stored data satisfies a maximum sub-page read size when the maximum sub-page read size is 4 KB or 8 KB. Notably, a 16 KB read (random or sequential) would not be completed at sub-page granularity as failing to comply with a maximum sub-page read size when the maximum sub-page read size is 4 KB or 8 KB. Rather, a full-page read or a memory buffer read is implemented.

Illustrated processing block 32 determines whether a read size matches a current sub-page read size. For example, there is a mismatch when a read size is 8 KB and a current sub-page read size is 4 KB. Since a maximum read size may be 8 KB and since the current sub-page read size does not provide sufficient granularity to accommodate the read size of 8 KB, block 32 may set the current sub-page read size to 8 KB and implement a new sub-page read size of 8 KB. Similarly, block 32 may set a current sub-page read size of 8 KB to a read size of 4 KB to implement a new sub-page read size of 4 KB. Thus, a most appropriate read size may be dynamically implemented.

Illustrated processing block 34 determines whether data for the read is present in a memory buffer, such as the memory buffer 14 (FIG. 1), discussed above, or any other memory buffer. For example, the data may have been stored in the memory buffer via a prior single-plane full-page read, via a prior multi-plane full-page read (discussed below), and so on. In one example, a prior 4 KB sequential read from among a series of 4 KB sequential reads is not completed at sub-page granularity as failing to comply with a random read requirement. In this case, the prior 4 KB sequential read may have been completed using a full-page read at full-page granularity (e.g., 16 KB), wherein 16 KB of sequentially located data was retrieved and placed in the memory buffer. Thus, block 34 determines that data corresponding to a subsequent 4 KB read may be in the memory buffer when a subsequent 4 KB sequential read is encountered (e.g., data offset by the first 4 KB into the 16 KB data in the memory buffer).

Additionally, multi-plane reads, such as a quad plane full-page reads, fetch data across four planes of a single page with a single read dispatch. For example, a single multi-plane full-page read command to the memory device, such as the memory device 12 (FIG. 1) may cause data from Planes 0-3 (FIG. 1), discussed above, to be simultaneously fetched with the same latency cost as a single-plane full-page read at four times the bandwidth (e.g., 64 KB vs. 16 KB). Thus, block 34 may determine whether data corresponding to a read, that is subsequent to a multi-plane read, is in the memory buffer. Illustrated processing block 36 reads the data at the memory buffer when the data is in the memory buffer. Moreover, block 36 may discontinue preparations being made to issue a page read command (e.g., a sub-page read, a full-page read, etc.) when data for the read is in the memory buffer.

Illustrated processing block 38 issues a page command when the data is not in the memory buffer. Generally, the command may include a controller command that has an address to indicate where to implement the operation and an instruction to indicate what to perform. Commands may include, for example, primary commands, vendor-unique commands that are not exposed to a user, and so on. Commands may further be classified as sub-page read commands or full-page read commands. In one example, block 38 may issue a sub-page read command to retrieve data from the memory device at sub-page granularity when the read satisfies a predetermined read size condition and a sub-page read policy. For example, a determination may be made at block 26 that a read satisfies a predetermined read size condition and at block 30 that the read satisfies a sub-page read policy, and block 38 issues a sub-page read command to retrieve data from the memory device at sub-page granularity.

Block 38 may, for example, issue a sub-page read command when a predetermined read size condition is not satisfied but when a sub-page policy is satisfied. For example, a separate read command for each segment of sequentially stored data may be prepared when a read from a host does not satisfy a predetermined read size condition, and block 38 issues a separate sub-page read command to retrieve each segment of sequentially stored data at sub-page granularity for which a corresponding read (e.g., for a particular separate read command) satisfies the sub-page read policy. Block 38 may also issue a separate full-page read command to retrieve each segment of sequentially stored data from the memory device at full-page granularity for which a corresponding read fails to satisfy a sub-page read policy.

Block 38 may further issue state-based commands. In one example, block 38 may issue a persistent state command to enter the memory device to a sub-page state or a full-page state. The sub-page state may allow the memory device to read data at the sub-page granularity until a full-page read is required. Accordingly, reads issued in the sub-page state are automatically implemented as sub-page reads since the memory device executes the reads at sub-page granularity until a full-page read is required. At that time, another persistent state command may be issued to change the state of the memory device. Similarly, the full-page state may allow the memory device to read data at a full-page granularity until a sub-page read is required. Thus, reads issued in the full-page state are automatically implemented as full-page reads since the memory device executes the reads at full-page granularity until a sub-page read is required. Cost associated with rational workload pipelining may be minimized by efficiencies in latency and bandwidth.

Block 38 may also issue a non-persistent toggle state command that includes three components appearing to the memory device as a single command. The first component may disable a default state of the memory device to allow the memory device to retrieve data at granularity specific to a non-default state. For example, the default state may be a sub-page state that is independently enabled on each die at start up. Thus, the first component may disable the default sub-page state to allow the memory device to retrieve data at full-page granularity for a next read. The second component may implement the next read at the granularity specific to the non-default state (e.g., full-page granularity), and the third component returns the memory device to the default state (e.g., sub-page state).

While independent blocks and/or a particular order has been shown for illustration purposes, it should be understood that one or more of the blocks of the method 24 may be combined, omitted, bypassed, re-arranged, and/or flow in any order. For example, block 26 may be bypassed and one or more determinations may be made in response to a receipt of a new read request. In one example, block 28 may determine each segment of sequentially stored data directly in response to a receipt of a new read request. In a further example, a read may be evaluated at block 30 to determine whether the read satisfies one or more sub-page read policies directly in response to a receipt of a new read request. Moreover, any or all blocks of the method 24 may be automatically implemented (e.g., without human intervention, etc.).

Figure 3:
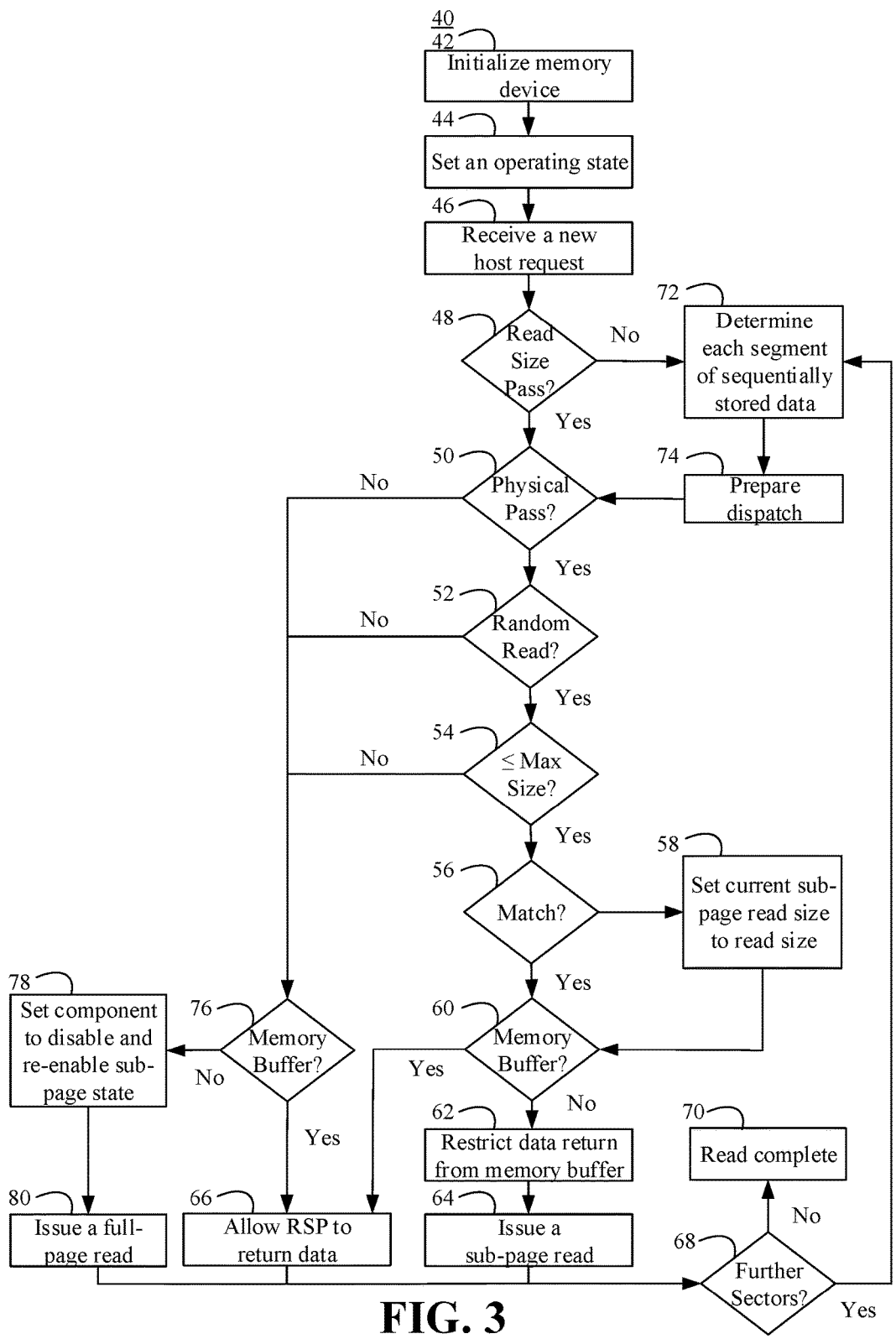
FIG. 3 is a flowchart of an example of a method to dynamically modulate read granularity for a read to a memory device where sub-page reads are enabled by default on the memory device according to an embodiment.

Turning now to FIG. 3, a method 40 is shown to dynamically modulate read granularity for a read to a memory device according to an embodiment. The method 40 may generally be implemented by a controller such as, for example, the controller 20 (FIG. 1), and/or in logic such as, for example, the logic 22 (FIG. 1), already discussed. The method 40 may be implemented as a set of logic instructions stored in a machine- or computer-readable storage medium such as RAM, ROM, PROM, firmware, flash memory, 3DXP memory, etc., in configurable logic such as, for example, PLAs, FPGAs, CPLDs, or any combination thereof.

Illustrated processing block 42 initializes (e.g., boots) a memory device, such as an SSD. In addition, illustrated block 44 then sets an operating state of the memory device. In the illustrated example, block 44 enables sub-page reads on all dice of the memory device as the default state of all the dice. Block 44 may also set and/or define one or more operating parameters such as a predetermined read size, a sub-page read policy, a maximum sub-page read size, a current sub-page read size, a Read Same Page (RSP), etc. Illustrated processing block 46 receives a new host read request, and a determination is made at block 48 whether a read for the new host read request satisfies a predetermined read size condition. For example, block 48 may compare the read size from the new read request that is received at block 46 to a configured 4 KB predetermined read size. In one example, a 4 KB read satisfies the 4 KB predetermined read size, while a read size greater than 4 KB (e.g., an 8 KB read, a 16 KB read, etc.) does not satisfy the 4 KB predetermined read size.

If the read satisfies the predetermined read size condition, a determination is made at block 50 whether the read satisfies a physical requirement of the memory device to implement a sub-page read (e.g., via a sub-page read command). For example, a sub-page read may be prohibited for a data block of a LUN that is open (e.g., at least one page within the data block has not been written). Thus, for example, a sub-page read is allowed to proceed for a closed data block and not for an open data block. If the read satisfies a physical requirement of the memory, a determination is made at block 52 whether the read satisfies a random read requirement to implement a sub-page read. In one example, a sub-page read is allowed to continue for a random read and not for a sequential read. If the read is a random read, a determination is made at block 54 whether the read satisfies a maximum sub-page read size to implement a sub-page read. For example, a comparison may be made at block 54 between the read size of the new read request received at block 46 and a maximum sub-page read size. Thus, for example, a 4 KB read satisfies a 4 KB or 8 KB sub-page read size (e.g., ≤4 KB or 8 KB), while a 16 KB read does not satisfy a 4 KB or 8 KB sub-page read size.

In the illustrated example, a determination is made at block 56 whether a read size matches a current sub-page read size. For example, a determination may be made at block 56 that a read size of 4 KB from a 4 KB read random matches a current sub-page read size of 4 KB. If, however, the read size does not match a current sub-page read size, illustrated processing block 58 sets the current sub-page read size to the read size to implement a new sub-page read size. For example, a read size of an 8 KB read does not match a current sub-page read size of 4 KB, and block 58 may dynamically change the current sub-page read size to 8 KB to accommodate the 8 KB read. In addition, a determination is made at block 60 whether data involved in the read is present in a memory buffer. The determination may be made via a hit on an RSP (e.g., Read Column Address) instruction. If the data is not present, illustrated processing block 62 restricts a data return from the memory buffer (e.g., invalidate RSP tag, etc.) during the read and illustrated processing block 64 issues a sub-page read command to retrieve data from the memory device (e.g., NAND array, etc.) at sub-page granularity. If the data is present, the preparation to issue the sub-page read command is discontinued and illustrated processing block 66 allows the RSP to proceed and return data from the memory buffer.

In the illustrated example, a determination is made at processing block 68 whether there are any further sectors of data remaining for the new read that was received at block 46. For example, a 4 KB sub-page read that has been issued at block 64 for a 4 KB read received at block 46 does not include any remaining sectors of data for the 4 KB read and the new host read request is complete at illustrated block 70. There may, however, be instances where sectors of data remain. For example, a determination may be made at block 48 that a read request received at block 46 does not satisfy the predetermined read size. For example, the read may be an 8 KB read that has a read size of 8 KB, a 16 KB read that has a read size of 16 KB, etc., and the predetermined read size is 4 KB. Thus, illustrated processing block 72 determines each segment of sequentially stored data for the read request received at block 46. Block 72 may identify a number of sectors placed sequentially on a die for remaining sectors from an initial sector.

Additionally, illustrated processing block 74 prepares to dispatch a separate read command for each segment to process a host read request that does not satisfy the predetermined read size condition at block 48. Thus, reads corresponding to each segment are independently evaluated, serially and/or in parallel, until no sectors of data remain at block 68 and the host read request is complete at block 70. For example, a first read for a first segment of first sequentially stored data is evaluated at blocks 50-54 to determine if the first read satisfies the sub-page read policies, wherein a second read for a second segment of second sequentially stored data may be independently evaluated serially and/or in parallel for the same, and so on. Moreover, a determination is made at block 76 whether data involved in the read is present in the memory buffer when any read does not satisfy the sub-page read policies at blocks 50-54. Block 76 may, therefore, utilize an RSP hit to determine if data is present in the memory buffer and if so, efforts to issue a full-page read command are discontinued and block 66 allows the RSP to proceed and return data from the memory buffer.

If the data is not present in the memory buffer, illustrated processing block 78 sets a component (e.g., a pre-trim command) of a non-persistent toggle state command to disable the sub-page state of the memory device that was set at block 44. In addition, block 78 sets a component (e.g., a post-trim command) to re-enable the sub-page state when the read corresponding to the full-page read to be issued at block 80 is complete. The non-persistent toggle state command also includes a component that causes the read to be dispatched at full-page granularity. Thus, illustrated processing block 80 issues a full-page read command sandwiched between the pre-trim and post-trim commands to read the data in the memory device at full-page size. When all segments are processed and all reads are dispatched, the read request received at block 46 is complete at block 70.

In operation, for example, the predetermined read size may be 4 KB and the maximum sub-page read size may be 8 KB. When a host issues a 64 KB read where all 64 KB of data is located on a single NAND die, flow passes to block 72 which determines that the 64 KB of data is located sequentially on NAND and then to block 74 which prepares to issue a single dispatch for the 64 KB read. Moreover, since the read size of 64 KB is greater than the maximum allowed sub-page read size (e.g., 8 KB, etc.), a sub-page read is not implemented. Rather, a memory buffer read (e.g., RSP) will be implemented at block 66 or a full-page read will be implemented at block 80 via a single read dispatch (e.g., a multi-plane read).

In another example, a host issues a 64 KB random read and the data is not sequential on NAND (e.g., spread across multiple die, etc.). In one example, a first 16 KB of data is located on die 0, a next 8 KB of data is located on die 1, a next 32 KB of data is located on die 2, and a next 8 KB of data is located on die 3. Accordingly, flow passes to block 72 which determines the segments of sequentially stored data (e.g., 16 KB, 8 KB, 32 KB, 8 KB) for the 64 KB random read. Block 72 may identify that of the entire 64 KB, from a first segment, only 16 KB is located sequentially on die 0. Block 74 then prepares to issue a command for the 16 KB segment, which fails the sub-page read policy at block 54. Thus, a sub-page read is not implemented.

Rather, a memory buffer read (e.g., RSP) will be implemented at block 66 or a full-page read will be implemented at block 80 via a single read dispatch. A determination is then made at block 68 that there are more sectors and/or segments remaining. The process repeats for the 8 KB segment which will be read via a sub-page read, the 32 KB segment which will be read via a full-page read or a memory buffer read, and for the last 8 KB segment which will be read via a sub-page read. The 64 KB random read is complete at block 70 when four separate reads at dynamically determined read granularity and/or read locations are complete.

In another example, a host issues a series of read requests corresponding to a series of 4 KB sequential reads. Thus, each 4 KB sequential read satisfies the predetermined read size condition at block 48 but fails the sub-page read policy at block 52 since the 4 KB sequential reads are not random reads. In this regard, each 4 KB sequential read may be dispatched as a full-page read or a memory buffer read (e.g., RSP). For example, an entire page (e.g., 16 KB) may be read during the first 4 KB sequential read, and held in the memory device buffer (e.g., cache) with 4 KB of data returned to the host when the read is complete at block 70. An RSP hit is then detected at block 76 for the next three 4 KB sequential reads in the series, and RSPs at block 66 will retrieve the data for the next three 4 KB sequential reads without a command to NAND when each of the next three 4 KB reads are evaluated. Thus, four separate sequential 4 KB reads may only incur latency associated with one full-page read.

The memory buffer may be implemented with static RAM (SRAM), FLOP, and/or latch technology to minimize latency cost. Additionally, bandwidth may also be increased since each NAND (e.g., memory device, LUN, die, etc.) may take any one command at any given time, complete it, and then accept another command. In this regard, there is no dependency on any other die because each die may be completely physically and/or logically independent. All NAND dice that comprise an SSD, for example, may be issuing a sub-page read and may be reading in parallel. Moreover, read granularity may be tailored to particular workloads to maximize bandwidth, minimize latency, preserve resources, and improve the functioning of a computer itself, of memory thereof, and so on.

While independent blocks and/or a particular order has been shown for illustration purposes, it should be understood that one or more of the blocks of the method 40 may be combined, omitted, bypassed, re-arranged, and/or flow in any order. Moreover, any or all blocks of the method 40 may be automatically implemented (e.g., without human intervention, etc.).

Figure 4:
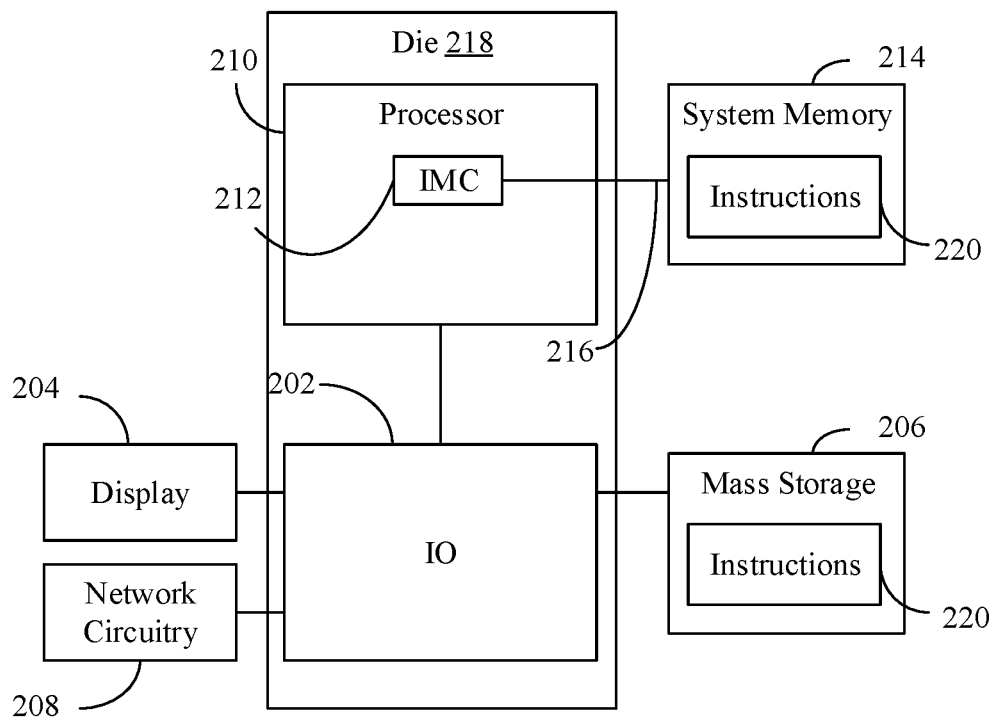
FIG. 4 is a block diagram of an example of a computing system according to an embodiment.

FIG. 4 shows a computing system 200 according to an embodiment. The system 200 may generally be part of a server, desktop computer, notebook computer, tablet computer, convertible tablet, smart television (TV), personal digital assistant (PDA), mobile Internet device (MID), smart phone, wearable device, media player, gaming console, etc., or any combination thereof. In the illustrated example, an input/output (IO) module 202 is communicatively coupled to a display 204 (e.g., liquid crystal display/LCD, light emitting diode/LED display, touch screen), a mass storage device 206 (non-volatile memory/NVM, hard disk drive/HDD, optical disk, solid state disk/SSD, flash memory) and a network interface circuitry 208 (e.g., network controller, network interface card/NIC).

The illustrated system 200 also includes a processor 210 (e.g., host processor, CPU) that includes an integrated memory controller (IMC) 212 which communicates with system memory 214 (e.g., volatile memory, dynamic random access memory/DRAM, 3DXP memory) over a bus 216 or other suitable communication interface. The communication interface may operate in compliance with, for example, NVMe (NVM Express) over PCIe (Peripheral Components Interconnect Express), SATA (Serial Advanced Technology Attachment), SAS (Serial Attached SCSI/Small Computer System Interface), PCIe, and so forth. In addition, the processor 210 and the IO module 202 may be integrated onto a shared semiconductor die 218 in a system on chip (SoC) architecture. In one example, the SoC components communicate via a bus architecture such as an Advance Microcontroller Bus Architecture (AMBA, ARM, Ltd.).

The mass storage device 206 may, for example, include non-volatile memory that may refer to a storage medium that does not require power to maintain the state of data stored by the medium. In one embodiment, a memory device is a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memsister technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product.

The system memory 214 may include, for example, volatile memory which may refer to a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www*jedec*org). Such standards (and similar standards) may be referred to as DDR-based standards and communication interfaces of the storage devices that implement such standards may be referred to as DDR-based interfaces.

Accordingly, the mass storage device 206 may be readily substituted for the memory device 12 (FIG. 1), already discussed. Moreover, the processor 210 may be readily substituted for the controller 20 (FIG. 1), already discussed. In addition, the mass storage device 206 and/or the system memory 214 may store instructions 220, which when executed by the processor 210, cause the system 200 to perform one or more aspects of the method 24 (FIG. 2) and/or of the method 40 (FIG. 3), already discussed. Thus, for example, the processor 210 may leverage sub-page read capabilities of the mass storage device 206 and/or data placement at the mass storage device 206 to optimally dispatch reads that minimize latency, maximize bandwidth, minimize waste of resources, etc., which improves the operation of the system 200, of mass storage device 206, etc.

Figure 5:
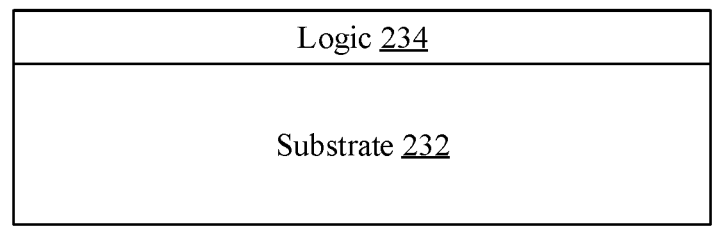
FIG. 5 is a block diagram of an example of a semiconductor package apparatus according to an embodiment.

Turning now to FIG. 5, a semiconductor package apparatus 230 (e.g., chip) is shown that includes a substrate 232 (e.g., silicon, sapphire, gallium arsenide, etc.) and logic 234 (e.g., transistor array and other integrated circuit/IC components) coupled to the substrate 232. The logic 234 may be readily substituted for the logic 22 (FIG. 1), already discussed. Moreover, the logic 234, which may be implemented at least partly in configurable logic and/or fixed-functionality logic hardware, may generally implement one or more aspects of the method 24 (FIG. 2) and/or of the method 40 (FIG. 3), already discussed. Thus, the controller 20 (FIG. 1), the logic 22 (FIG. 1), the processor 210 (FIG. 4), and/or the logic 234 may implement the same or similar functionality. In one example, the logic 234 may leverage sub-page read capabilities of a memory device and/or data placement at the memory device to optimally dispatch reads that minimize latency, maximize bandwidth, minimize waste of resources, etc., which improves the operation of a computer, of a memory device thereof, and so on.

ADDITIONAL NOTES AND EXAMPLES

Example 1 may include a computing system to dynamically modulate read granularity comprising a controller and one or more memory devices coupled to the controller, the one or more memory devices including instructions, which when executed by the controller, cause the computing system to determine whether a read to a memory device satisfies a sub-page read policy, and issue a sub-page read command to retrieve data from the memory device at sub-page granularity when the read satisfies the sub-page read policy.

Example 2 may include the computing system of Example 1, wherein the instructions, when executed, cause the computing system to determine whether the read satisfies a physical requirement, determine whether the read satisfies a random read requirement, and determine whether the read satisfies a maximum sub-page read size.

Example 3 may include the computing system of any one of Examples 1 to 2, wherein the instructions, when executed, cause the computing system to determine whether a read size of the read matches a current sub-page read size, and set the current sub-page read size to the read size to implement a new sub-page read size.

Example 4 may include the computing system of any one of Examples 1 to 3, wherein the instructions, when executed, cause the computing system to determine whether the data is present in a memory buffer, discontinue preparation to issue the sub-page read command and retrieve the data from the memory buffer when the data is present in the memory buffer, and issue the sub-page read command when the data is not present in the memory buffer.

Example 5 may include the computing system of any one of Examples 1 to 4, wherein the instructions, when executed, cause the computing system to determine each segment of sequentially stored data for the read when the read does not satisfy a predetermined read size condition, prepare to dispatch a separate read command for each segment, determine whether each read for each segment of sequentially stored data satisfies the sub-page read policy, and issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

Example 6 may include the computing system of any one of Examples 1 to 5, wherein the instructions, when executed, cause the computing system to issue a full-page read command to retrieve the data at full-page granularity when the read does not satisfy the sub-page read policy or when a read for a segment of sequentially stored data does not satisfy the sub-page read policy.

Example 7 may include the computing system of any one of Examples 1 to 6, wherein the instructions, when executed, cause the computing system to discontinue preparation to issue the full-page read command and retrieve the data from a memory buffer when the data is present in a memory buffer, and discontinue preparation to issue the full-page read command and retrieve the sequentially stored data from the memory buffer when the sequentially stored data is present in the memory buffer, wherein one or more of the data or the sequentially stored data are to be placed in the memory buffer via a prior single-plane full-page read or a prior multi-plane full-page read.

Example 8 may include the computing system of any one of Examples 1 to 7, wherein the instructions, when executed, cause the computing system to issue a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required, or issue a non-persistent toggle state command that is to disable a default state of the memory device to allow the memory device to retrieve data at granularity specific to a non-default state, implement one read at the granularity specific to the non-default state, and re-enable the default state when the one read is complete.

Example 9 may include an apparatus to dynamically modulate read granularity comprising a substrate, and logic coupled to the substrate, wherein the logic includes one or more of configurable logic or fixed-functionality hardware logic, the logic coupled to the substrate to determine whether a read to a memory device satisfies a sub-page read policy, and issue a sub-page read command to retrieve data from the memory device at sub-page granularity when the read satisfies the sub-page read policy.

Example 10 may include the apparatus of Example 9, wherein the logic is to determine whether the read satisfies a physical requirement, determine whether the read satisfies a random read requirement, and determine whether the read satisfies a maximum sub-page read size.

Example 11 may include the apparatus of any one of Examples 9 to 10, wherein the logic is to determine whether a read size of the read matches a current sub-page read size, and set the current sub-page read size to the read size to implement a new sub-page read size.

Example 12 may include the apparatus of any one of Examples 9 to 11, wherein the logic is to determine whether the data is present in a memory buffer, discontinue preparation to issue the sub-page read command and retrieve the data from the memory buffer when the data is present in the memory buffer, and issue the sub-page read command when the data is not present in the memory buffer.

Example 13 may include the apparatus of any one of Examples 9 to 12, wherein the logic is to determine each segment of sequentially stored data for the read when the read does not satisfy a predetermined read size condition, prepare to dispatch a separate read command for each segment, determine whether each read for each segment of sequentially stored data satisfies the sub-page read policy, and issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

Example 14 may include the apparatus of any one of Examples 9 to 13, wherein the logic is to issue a full-page read command to retrieve the data at full-page granularity when the read does not satisfy the sub-page read policy or when a read for a segment of sequentially stored data does not satisfy the sub-page read policy.

Example 15 may include the apparatus of any one of Examples 9 to 14, wherein the logic is to discontinue preparation to issue the full-page read command and retrieve the data from a memory buffer when the data is present in a memory buffer, and discontinue preparation to issue the full-page read command and retrieve the sequentially stored data from the memory buffer when the sequentially stored data is present in the memory buffer, wherein one or more of the data or the sequentially stored data are to be placed in the memory buffer via a prior single-plane full-page read or a prior multi-plane full-page read.

Example 16 may include the apparatus of any one of Examples 9 to 15, wherein the logic is to issue a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required, or issue a non-persistent toggle state command that is to disable a default state of the memory device to allow the memory device to retrieve data at granularity specific to a non-default state, implement one read at the granularity specific to the non-default state, and re-enable the default state when the one read is complete.

Example 17 may include at least one computer readable storage medium comprising a set of instructions, which when executed by a processor, cause the processor to determine whether a read to a memory device satisfies a sub-page read policy, and issue a sub-page read command to retrieve data from the memory device at sub-page granularity when the read satisfies the sub-page read policy.

Example 18 may include the at least one computer readable storage medium of Example 17, wherein the instructions, when executed, cause the processor to determine whether the read satisfies a physical requirement, determine whether the read satisfies a random read requirement, and determine whether the read satisfies a maximum sub-page read size.

Example 19 may include the at least one computer readable storage medium of any one of Examples 17 to 18, wherein the instructions, when executed, cause the processor to determine whether a read size of the read matches a current sub-page read size, and set the current sub-page read size to the read size to implement a new sub-page read size.

Example 20 may include the at least one computer readable storage medium of any one of Examples 17 to 19, wherein the instructions, when executed, cause the processor to determine whether the data is present in a memory buffer, discontinue preparation to issue the sub-page read command and retrieve the data from the memory buffer when the data is present in the memory buffer, and issue the sub-page read command when the data is not present in the memory buffer.

Example 21 may include the at least one computer readable storage medium of any one of Examples 17 to 20, wherein the instructions, when executed, cause the processor to determine each segment of sequentially stored data for the read when the read does not satisfy a predetermined read size condition, prepare to dispatch a separate read command for each segment, determine whether each read for each segment of sequentially stored data satisfies the sub-page read policy, and issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

Example 22 may include the at least one computer readable storage medium of any one of Examples 17 to 21, wherein the instructions, when executed, cause the processor to issue a full-page read command to retrieve the data at full-page granularity when the read does not satisfy the sub-page read policy or when a read for a segment of sequentially stored data does not satisfy the sub-page read policy.

Example 23 may include the at least one computer readable storage medium of any one of Examples 17 to 22, wherein the instructions, when executed, cause the processor to discontinue preparation to issue the full-page read command and retrieve the data from a memory buffer when the data is present in a memory buffer, and discontinue preparation to issue the full-page read command and retrieve the sequentially stored data from the memory buffer when the sequentially stored data is present in the memory buffer, wherein one or more of the data or the sequentially stored data are to be placed in the memory buffer via a prior single-plane full-page read or a prior multi-plane full-page read.

Example 24 may include the at least one computer readable storage medium of any one of Examples 17 to 23, wherein the instructions, when executed, cause the processor to issue a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required, or issue a non-persistent toggle state command that is to disable a default state of the memory device to allow the memory device to retrieve data at granularity specific to a non-default state, implement one read at the granularity specific to the non-default state, and re-enable the default state when the one read is complete.

Example 25 may include a method to dynamically modulate read granularity comprising determining whether a read to a memory device satisfies a sub-page read policy, and issuing a sub-page read command to retrieve data from the memory device at sub-page granularity when the read satisfies the sub-page read policy.

Example 26 may include the method of Example 25, further including determining whether the read satisfies a physical requirement, determining whether the read satisfies a random read requirement, and determining whether the read satisfies a maximum sub-page read size.

Example 27 may include the method of any one of Examples 25 to 26, further including determining whether a read size of the read matches a current sub-page read size, and setting the current sub-page read size to the read size to implement a new sub-page read size.

Example 28 may include the method of any one of Examples 25 to 27, further including determining whether the data is present in a memory buffer, discontinuing preparation to issue the sub-page read command and retrieving the data from the memory buffer when the data is present in the memory buffer, and issuing the sub-page read command when the data is not present in the memory buffer.

Example 29 may include the method of any one of Examples 25 to 28, further including determining each segment of sequentially stored data for the read when the read does not satisfy a predetermined read size condition, preparing to dispatch a separate read command for each segment, determining whether each read for each segment of sequentially stored data satisfies the sub-page read policy, and issuing a separate sub-page read command to retrieve each segment of sequentially stored data at sub-page granularity for which a corresponding read satisfies the sub-page read policy and issuing a separate full-page read command to retrieve each segment of sequentially stored data at full-page granularity for which a corresponding read does not satisfy the sub-page read policy.

Example 30 may include the method of any one of Examples 25 to 29, further including issuing a full-page read command to retrieve the data at full-page granularity when the read does not satisfy the sub-page read policy or when a read for a segment of sequentially stored data does not satisfy the sub-page read policy.

Example 31 may include the method of any one of Examples 25 to 30, further including discontinuing preparation to issue the full-page read command and retrieve the data from a memory buffer when the data is present in a memory buffer, and discontinuing preparation to issue the full-page read command and retrieve the sequentially stored data from the memory buffer when the sequentially stored data is present in the memory buffer, wherein one or more of the data or the sequentially stored data are to be placed in the memory buffer via a prior single-plane full-page read or a prior multi-plane full-page read.

Example 32 may include the method of any one of Examples 25 to 31, further including issuing a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required, or issuing a non-persistent toggle state command that is to disable a default state of the memory device to allow the memory device to retrieve data at granularity specific to a non-default state, implement one read at the granularity specific to the non-default state, and re-enable the default state when the one read is complete.

Example 33 may include a memory device to read data at sub-page granularity comprising non-volatile memory including data that is to be involved in a read, wherein the data is to be retrieved from the non-volatile memory at sub-page granularity in response to a sub-page read command when the read satisfies a sub-page read policy.

Example 34 may include the memory device of Example 33, wherein the memory device is to implement a dynamic change of a current sub-page read size when set to a read size of the read.

Example 35 may include the memory device of any one of Examples 33 to 34, wherein the data is not to be retrieved from a logical unit node when the data is present in a memory buffer.

Example 36 may include the memory device of any one of Examples 33 to 35, wherein, in response to a separate sub-page read command, each segment of sequentially stored data is to be retrieved at sub-page granularity for which a corresponding read satisfies the sub-page read policy, and wherein, in response to a separate full-page read command, each segment of sequentially stored data is to be retrieved at full-page granularity for which a corresponding read does not satisfy the sub-page read policy.

Example 37 may include the memory device of any one of Examples 33 to 36, wherein, in response to a full-page read command, the data is to be retrieved at full-page granularity when the read does not satisfy the sub-page read policy or a segment of sequentially stored data is to be retrieved at full-page granularity when a read does not satisfy the sub-page read policy.

Example 38 may include the memory device of any one of Examples 33 to 37, wherein the memory device is to implement a sub-page state or a full-page state in response to a persistent state command, or implement disablement of a default state to retrieve data at granularity specific to a non-default state, implement one read at the granularity specific to the non-default state, and implement re-enablement of the default state when the one read is complete in response to a non-persistent toggle state command.

Example 39 may include an apparatus to dynamically modulate read granularity comprising means for performing the method of any one of Examples 25 to 32.

Technology described herein may therefore allow reads to a memory device at sub-page granularity. Implementations may leverage enabling and disabling a sub-page read size for workloads and/or may leverage physical data placement that does not incur extra latency for data a host does not need. For example, when a host reads at 4 KB granularity, reading at full page size may incur extra latency and/or waste resources. However, when a host reads at 16 KB granularity, reading at full page granularity may be appropriate to provide overall better bandwidth. Moreover, full-page reads may load adjacent planes via a multi-plane read into a memory buffer to improve performance (e.g., quad-plane device may provide four times the improvement on bandwidth, etc.). Thus, embodiments may enable sub-page reads on each die by default (e.g., in firmware, etc.) and use controller commands to disable sub-page reads for full page sized reads to issue a full-page read to a target die.

In one implementation, enabling/disabling sub-page reads may be accomplished with vendor-defined commands. For example, sub-page reads may be enabled and disabled dynamically at run by atomic vendor-defined commands (e.g., trim commands) to NAND. Sub-page reads may, for example, be enabled by default on each NAND die on power up by issuing an appropriate NAND Set Feature Command to each die as a separate NAND work. In this regard, each NAND die in a system may have its own independent sub-page read state. For relatively large host reads of greater than sub-page read size, atomic trim commands may then disable sub-page reads only for the current read. These commands may be part of the same NAND work item used for data reads and therefore may be relatively fast. In one example, a pre-trim command disables sub-page reads before actual data is read. Then, an entire page is read. The full-page read is immediately followed by a post-trim configured to re-enable sub-page reads on the target die as the default state after the NAND read. As sub-page reads are enabled by default, any further sub-page read will not incur additional NAND channel overhead.

Policies may be implemented to enable and maintain a sub-page read state. For example, a sub-page read may be enabled if a target read size on a die, which may be determined by identifying physical data placement, is less than or equal to a configured sub-page read size (e.g., up to half a page). In addition, multiple sub-page reads may be issued across various dice in parallel to improve overall performance. Moreover, sub-page reads may be disabled for host workloads that are sequential in nature. Thus, using a full-page read may be a better approach when a single full-page read serves multiple subsequent read requests.

Notably, technologies to provide sub-page reads may significantly improve performance on memory devices (e.g., SSDs) across substantially all queue depths. For example, sub-page reads may increase performance from 491,565 input/output operations per second (IOPS) to 695,907 IOPS. Performance upside may be as high as 75.8%, as seen on 4 KB random reads (queue depth (QD)=256) on a 480 GB memory device, improving from 85,060 TOPS to 149,511 IOPS without affecting performance stability. In this regard, testing using a logic analyzer to snoop a NAND bus may provide the metrics (e.g., tR, etc.) for every command to NAND to test performance and/or to provide performance-based deployment of sub-page reads tailored to user-specific and/or workload-specific requirements such as throughput, bandwidth, latency, power, etc.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" or "at least one of" may mean any combination of the listed terms. For example, the phrases "one or more of A, B or C" may mean A; B; C; A and B; A and C; B and C; or A, B and C. In addition, a list of items joined by the term "and so on" or "etc." may mean any combination of the listed terms as well any combination with other terms.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
 a controller; and
 one or more memory devices coupled to the controller, the one or more memory devices including instructions, which when executed by the controller, cause the computing system to:
 determine whether a read to a memory device satisfies a sub-page read policy; and
 issue a sub-page read command to retrieve data from the memory device at sub-page granularity when the read satisfies the sub-page read policy, the computing system further to:
 issue a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required; or issue a non-persistent toggle state command that is to disable a default state of the memory device to allow the memory device to retrieve data at granularity specific to a non-default state, implement one read at the granularity specific to the non-default state, and re-enable the default state when the one read is complete.

2. The computing system of claim 1, wherein the instructions, when executed, cause the computing system to:
determine whether the read satisfies a physical requirement;
determine whether the read satisfies a random read requirement; and
determine whether the read satisfies a maximum sub-page read size.

3. The computing system of claim 1, wherein the instructions, when executed, cause the computing system to:
determine whether a read size of the read matches a current sub-page read size; and
set the current sub-page read size to the read size to implement a new sub-page read size.

4. The computing system of claim 1, wherein the instructions, when executed, cause the computing system to:
determine whether the data is present in a memory buffer;
discontinue preparation to issue the sub-page read command and retrieve the data from the memory buffer when the data is present in the memory buffer; and
issue the sub-page read command when the data is not present in the memory buffer.

5. The computing system of claim 1, wherein the instructions, when executed, cause the computing system to:
determine each segment of sequentially stored data for the read when the read does not satisfy a predetermined read size condition;
prepare to dispatch a separate read command for each segment;
determine whether each read for each segment of sequentially stored data satisfies the sub-page read policy; and
issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

6. The computing system of claim 1, wherein the instructions, when executed, cause the computing system to issue a full-page read command to retrieve the data at full-page granularity when the read does not satisfy the sub-page read policy or when a read for a segment of sequentially stored data does not satisfy the sub-page read policy.

7. The computing system of claim 6, wherein the instructions, when executed, cause the computing system to:
discontinue preparation to issue the full-page read command and retrieve the data from a memory buffer when the data is present in a memory buffer; and
discontinue preparation to issue the full-page read command and retrieve the sequentially stored data from the memory buffer when the sequentially stored data is present in the memory buffer, wherein one or more of the data or the sequentially stored data are to be placed in the memory buffer via a prior single-plane full-page read or a prior multi-plane full-page read.

8. An apparatus comprising:
a substrate; and
logic coupled to the substrate, wherein the logic includes one or more of configurable logic or fixed-functionality hardware logic, the logic coupled to the substrate to:
determine whether a read to a memory device satisfies a sub-page read policy; and
issue a sub-page read command to retrieve data from the memory device at sub-page granularity when the read satisfies the sub-page read policy, the logic further to:
issue a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required; or
issue a non-persistent toggle state command that is to disable a default state of the memory device to allow the memory device to retrieve data at granularity specific to a non-default state, implement one read at the granularity specific to the non-default state, and re-enable the default state when the one read is complete.

9. The apparatus of claim 8, wherein the logic is to:
determine whether the read satisfies a physical requirement;
determine whether the read satisfies a random read requirement; and
determine whether the read satisfies a maximum sub-page read size.

10. The apparatus of claim 8, wherein the logic is to:
determine whether a read size of the read matches a current sub-page read size; and
set the current sub-page read size to the read size to implement a new sub-page read size.

11. The apparatus of claim 8, wherein the logic is to:
determine whether the data is present in a memory buffer;
discontinue preparation to issue the sub-page read command and retrieve the data from the memory buffer when the data is present in the memory buffer; and
issue the sub-page read command when the data is not present in the memory buffer.

12. The apparatus of claim 8, wherein the logic is to:
determine each segment of sequentially stored data for the read when the read does not satisfy a predetermined read size condition;
prepare to dispatch a separate read command for each segment;
determine whether each read for each segment of sequentially stored data satisfies the sub-page read policy; and
issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

13. The apparatus of claim 8, wherein the logic is to issue a full-page read command to retrieve the data at full-page granularity when the read does not satisfy the sub-page read policy or when a read for a segment of sequentially stored data does not satisfy the sub-page read policy.

14. At least one non-transitory computer readable storage medium comprising a set of instructions, which when executed by a processor, cause the processor to:

determine whether a read to a memory device satisfies a sub-page read policy; and issue a sub-page read command to retrieve data from the memory device at sub-page granularity when the read satisfies the sub-page read policy, the processor further to:

issue a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required; or issue a non-persistent toggle state command that is to disable a default state of the memory device to allow the memory device to retrieve data at granularity specific to a non-default state, implement one read at the granularity specific to the non-default state, and re-enable the default state when the one read is complete.

15. The at least one non-transitory computer readable storage medium of claim 14, wherein the instructions, when executed, cause the processor to:

determine whether the read satisfies a physical requirement;

determine whether the read satisfies a random read requirement; and determine whether the read satisfies a maximum sub-page read size.

16. The at least one non-transitory computer readable storage medium of claim 14, wherein the instructions, when executed, cause the processor to:

determine whether a read size of the read matches a current sub-page read size; and set the current sub-page read size to the read size to implement a new sub-page read size.

17. The at least one non-transitory computer readable storage medium of claim 14, wherein the instructions, when executed, cause the processor to:

determine whether the data is present in a memory buffer;

discontinue preparation to issue the sub-page read command and retrieve the data from the memory buffer when the data is present in the memory buffer; and issue the sub-page read command when the data is not present in the memory buffer.

18. The at least one non-transitory computer readable storage medium of claim 14, wherein the instructions, when executed, cause the processor to:

determine each segment of sequentially stored data for the read when the read does not satisfy a predetermined read size condition;

prepare to dispatch a separate read command for each segment;

determine whether each read for each segment of sequentially stored data satisfies the sub-page read policy; and issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

19. The at least one non-transitory computer readable storage medium of claim 14, wherein the instructions, when executed, cause the processor to issue a full-page read command to retrieve the data at full-page granularity when the read does not satisfy the sub-page read policy or when a read for a segment of sequentially stored data does not satisfy the sub-page read policy.

20. A method comprising:

determining whether a read to a memory device satisfies a sub-page read policy; and issuing a sub-page read command to retrieve data from the memory device at sub-page granularity when the read satisfies the sub-page read policy, the method further including:

issuing a persistent state command to enter the memory device to a sub-page state or a full-page state, wherein the sub-page state allows the memory device to read data at the sub-page granularity until a full-page read is required, and wherein the full-page state allows the memory device to read data at a full-page granularity until a sub-page read is required; or issuing a non-persistent toggle state command that is to disable a default state of the memory device to allow the memory device to retrieve data at granularity specific to a non-default state, implement one read at the granularity specific to the non-default state, and re-enable the default state when the one read is complete.

21. The method of claim 20, further including:

determining whether the read satisfies a physical requirement;

determining whether the read satisfies a random read requirement; and determining whether the read satisfies a maximum sub-page read size.

22. The method of claim 20, further including issuing a full-page read command to retrieve the data at full-page granularity when the read does not satisfy the sub-page read policy or when a read for a segment of sequentially stored data does not satisfy the sub-page read policy.

23. An apparatus comprising:

a substrate; and logic coupled to the substrate, wherein the logic includes one or more of configurable logic or fixed-functionality hardware logic, the logic coupled to the substrate to:

determine whether a read to a memory device satisfies a sub-page read policy;

issue a sub-page read command to retrieve data from the memory device at sub-page granularity when the read satisfies the sub-page read policy, the logic further to:

determine each segment of sequentially stored data for the read when the read does not satisfy a predetermined read size condition;

prepare to dispatch a separate read command for each segment;

determine whether each read for each segment of sequentially stored data satisfies the sub-page read policy; and issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

24. At least one non-transitory computer readable storage medium comprising a set of instructions, which when executed by a processor, cause the processor to:

determine whether a read to a memory device satisfies a sub-page read policy; and issue a sub-page read command to retrieve data from the memory device at sub-page granularity when the read satisfies the sub-page read policy, the processor further to:

determine each segment of sequentially stored data for the read when the read does not satisfy a predetermined read size condition;

prepare to dispatch a separate read command for each segment;

determine whether each read for each segment of sequentially stored data satisfies the sub-page read policy; and issue a separate sub-page read command to retrieve each segment of sequentially stored data at sub-page granularity for which a corresponding read satisfies the sub-page read policy and issue a separate full-page read command to retrieve each segment of sequentially stored data at full-page granularity for which a corresponding read does not satisfy the sub-page read policy.

25. A method comprising:

determining whether a read to a memory device satisfies a sub-page read policy; and issuing a sub-page read command to retrieve data from the memory device at sub-page granularity when the read satisfies the sub-page read policy, the method further including:

determining each segment of sequentially stored data for the read when the read does not satisfy a predetermined read size condition;

preparing to dispatch a separate read command for each segment;

determining whether each read for each segment of sequentially stored data satisfies the sub-page read policy; and issuing a separate sub-page read command to retrieve each segment of sequentially stored data at sub-page granularity for which a corresponding read satisfies the sub-page read policy and issuing a separate full-page read command to retrieve each segment of sequentially stored data at full-page granularity for which a corresponding read does not satisfy the sub-page read policy.

* * * * *